United States Patent
Matsushita

(10) Patent No.: US 7,521,844 B2
(45) Date of Patent: Apr. 21, 2009

(54) PIEZOELECTRIC SINGLE-CRYSTAL DEVICE AND METHOD OF MANUFACTURING THE SAME

(75) Inventor: Mitsuyoshi Matsushita, Chiba (JP)

(73) Assignee: JFE Mineral Company, Ltd., Tokyo (JP)

( * ) Notice: Subject to any disclaimer, the term of this patent is extended or adjusted under 35 U.S.C. 154(b) by 0 days.

(21) Appl. No.: 11/579,002

(22) PCT Filed: Oct. 28, 2004

(86) PCT No.: PCT/JP2004/016371

§ 371 (c)(1),
(2), (4) Date: Jan. 3, 2007

(87) PCT Pub. No.: WO2005/106986

PCT Pub. Date: Nov. 10, 2005

(65) Prior Publication Data

US 2007/0228896 A1    Oct. 4, 2007

(30) Foreign Application Priority Data

Apr. 30, 2004    (JP) .................... 2004-135313

(51) Int. Cl.
*H01L 41/187* (2006.01)
(52) U.S. Cl. ........................ 310/357; 310/358; 310/368
(58) Field of Classification Search .............. 310/368, 310/357
See application file for complete search history.

(56) References Cited

U.S. PATENT DOCUMENTS

| | | |
|---|---|---|
| 2002/0153809 A1 | 10/2002 | Chen et al. |
| 2003/0137221 A1 | 7/2003 | Radziemski et al. |
| 2003/0178914 A1 * | 9/2003 | Ogawa et al. ............... 310/311 |
| 2004/0232803 A1 * | 11/2004 | Matsushita et al. ........... 310/358 |
| 2005/0184627 A1 * | 8/2005 | Sano et al. ................... 310/363 |
| 2006/0091353 A1 * | 5/2006 | Matsushita et al. ....... 252/62.9 R |

FOREIGN PATENT DOCUMENTS

JP    A-11-171644    6/1999

OTHER PUBLICATIONS

Rui Zhang et al., Elastic, Piezoelectric, and Dielectric Properties of Multidomain 0.67Pb(Mg⅓Nb⅔)O3—0.33PbTiO3 Single Crystals, Oct. 1, 2001, Journal of Applied Physics, vol. 90, No. 7, pp. 3471-3475.

(Continued)

*Primary Examiner*—Quyen P Leung
*Assistant Examiner*—Bryan P Gordon
(74) *Attorney, Agent, or Firm*—Oliff & Berridge, PLC

(57) ABSTRACT

To provide a piezoelectric single-crystal device which can stably attain an electromechanical coupling factor $k_{31}$ of 60% or more in the lateral vibration mode and a method of manufacturing the same. Specifically, the piezoelectric single-crystal device has the polarization direction 3 in the [110] axis of a pseudocubic system and has the direction normal to an end face 10c of the piezoelectric device within the solid angle range of the [001] axis ±35° including the [001] axis approximately orthogonal to the polarization direction 3. The electromechanical coupling factor $k_{31}$ in the direction orthogonal to the polarization direction 3, in the so-called lateral vibration mode, is 60% or more.

9 Claims, 5 Drawing Sheets

OTHER PUBLICATIONS

Toshio Ogawa et al., Poling Field Dependence of Ferroelectric Properties in $Pb(Zn_{1/3}Nb_{2/3})_{0.91}Ti_{0.09}O_3$ Single Crystal, Program Summary and Extended Abstracts of the 10th US-Japan Seminar on Dielectric and Piezoelectric Ceramics, Sep. 26-29, 2001 pp. 245-248.

* cited by examiner

○ : OXYGEN ION
● : M ION
⊘ : R ION

ELECTRODE PLANE

VIBRATION DIRECTION

US 7,521,844 B2

PIEZOELECTRIC SINGLE-CRYSTAL DEVICE AND METHOD OF MANUFACTURING THE SAME

TECHNICAL FIELD

The present invention relates to piezoelectric single-crystal devices and methods for manufacturing the same. More specifically, the present invention relates to piezoelectric single-crystal devices formed of a piezoelectric single-crystal material having a complex perovskite structure of a pseudocubic system and having an electromechanical coupling factor $k_{31}$ of 60% or more. The piezoelectric single-crystal material is a solid solution represented by $Pb[(Mg, Nb)_{1-x}Ti_x]O_3$ (referred to as PMN-PT or PMNT) composed of lead magnesium niobate $(Pb(Mg, Nb)O_3)$ and lead titanate $(PbTiO_3)$. The electromechanical coupling factor $k_{31}$ is in the direction orthogonal to the polarization direction, in the so-called lateral vibration mode. The present invention further relates to methods of manufacturing such piezoelectric single-crystal devices.

BACKGROUND ART

When a piezoelectric single-crystal device is, for example, a rectangular plate having an aspect ratio (a/b) of 2.5 or more (a/b≧2.5, a>>L, b>>L) as shown in FIG. 1 and a voltage is applied to the polarization direction 3, an electromechanical coupling factor $k_{31}$ in the lateral vibration mode is proportional to a square root of a conversion efficiency of an electric energy and a mechanical energy relating to the magnitude of vibration (lateral vibration) in the direction 1 orthogonal to the polarization direction 3. The greater $k_{31}$ value is, the higher the conversion efficiency is. Examples of the shape of the piezoelectric single-crystal device include the above-mentioned rectangular plate, a square plate, a circular plate, and a bar. The electromechanical coupling factor $k_{31}$ can be similarly determined for each differently shaped device.

Conventionally, as a material constituting the piezoelectric device, lead zirconium titanate $(Pb(Zr, Ti)O_3: PZT)$ has been widely used as described in T. Ogawa, M. Matsushita, Y. Tachi, and K. Echizenya, "Program Summary and Extended Abstracts of the 10$^{th}$ US-Japan Seminar on Dielectric and Piezoelectric Ceramics" (Sep. 26-29, (2001), pp. 245-248). However, in the device using lead zirconium titanate (PZT) disclosed in the paper of Ogawa, et al., the electromechanical coupling factor $k_{31}$ is about 30%.

With a view to achieving an electromechanical coupling factor $k_{31}$ value higher than that of PZT, a piezoelectric porcelain composition is disclosed in Japanese Unexamined Patent Application Publication No. 11-171644, for example. The piezoelectric porcelain composition includes $x(Pb_2Me_2O_7)½·(1-x)[Pb(Zr_{1-y}Ti_y)O_3]$ as a primary component and Cr and Si as accessory components. However, the electromechanical coupling factor $k_{31}$ of the piezoelectric porcelain composition disclosed in Japanese Unexamined Patent Application Publication No. 11-171644 is 40% or less.

In addition, Jpn. J. Appl. Phys. 90 (2001), pp. 3471-3475 discloses piezoelectric properties of a single crystal, $0.67Pb(Mg_{1/3}Nb_{2/3})O_3\text{-}0.33PbTiO_3$, by measuring the lateral vibration mode $k_{31}$ in the [100] direction or the [010] direction when the polarization direction is the [001] direction. The electromechanical coupling factor $k_{31}$ is 59%.

DISCLOSURE OF INVENTION

It is an object of the present invention to provide a piezoelectric single-crystal device which can stably attain an electromechanical coupling factor $k_{31}$ of 60% or more and a method of manufacturing the same. The electromechanical coupling factor $k_{31}$ of 60% or more is achieved by properly controlling the polarization direction 3 and the direction 1 normal to an end face T of the piezoelectric device.

The present invention for achieving the above-mentioned object will be summarized below.

(1) A piezoelectric single-crystal device has the polarization direction in the [110] axis of a pseudocubic system and the direction normal to an end face of the piezoelectric device within the solid angle range of the [001] axis ±35° including the [001] axis approximately orthogonal to the polarization direction. The electromechanical coupling factor $k_{31}$ in the direction orthogonal to the polarization direction, in the so-called lateral vibration mode, of the piezoelectric single-crystal device is 60% or more.

(2) The piezoelectric single-crystal device in the above (1) is formed of a piezoelectric single-crystal material being a solid solution composed of $Pb[(Mg, Nb)_{1-x}Ti_x]O_3$ and having a complex perovskite structure. The X represents the molar fraction of Ti when the total molar fractions of Mg, Nb, and Ti is 1 and satisfies the formula, 0.1<X<0.35.

Here, the term "pseudocubic system" means not only a cubic system but also a rhombohedral system of which angles formed of three crystallographical axes are each within the range of 90°±1° or a crystal mixture of a rhombohedral system and a tetragonal system.

The term "perovskite structure" means a structure $(RMO_3)$ of a unit lattice of a solid solution single-crystal schematically shown in FIG. 2, namely, R ions are positioned at the vertices of the unit lattice; oxygen ions are positioned at the face centers of the unit lattice; and an M ion is positioned at the body center of the unit lattice. In a "complex perovskite structure" which is the subject of the present invention, the M ion positioned at the body center in FIG. 2 is not composed of one kind of element ion but composed of at least two kinds of element ions. Furthermore, the [001] axis in the present invention may be in any direction of the sides of a unit lattice having the perovskite structure.

(3) In the above (2), the solid solution for the piezoelectric single-crystal device further contains 0.05 to 30 mol % of In.

(4) A method of manufacturing the piezoelectric single-crystal device according to any one of the above (1) to (3) includes a step of main polarization to be conducted before or after the cutting of a single-crystal ingot into a single-crystal device material having a predetermined shape in a predetermined direction. The main polarization step is conducted by applying an electric field under predetermined conditions in the [110] direction, which is the direction to be polarized, of the single-crystal ingot, the cut-out single-crystal block, or the cut-out single-crystal device.

(5) In the above (4), the method of manufacturing the piezoelectric single-crystal device includes a main polarization step for polarizing the single-crystal ingot or the single-crystal block in the [110] direction by applying an electric field under predetermined conditions and a step for cutting the single-crystal ingot or the single-crystal block into a single-crystal device having a predetermined shape in a predetermined direction.

(6) In the method of manufacturing the piezoelectric single-crystal device in the above (4) or (5), the main polarization step is conducted by applying a direct-current electric field of 350 to 1500 V/mm to the single-crystal ingot or the single-crystal block along the [110] direction in the temperature range of 20 to 200° C., or by applying a direct-current electric field of 250 to 500 V/mm at a temperature higher than the Curie temperature (Tc) of the single-crystal ingot or the single-crystal block and decreasing the temperature to a room temperature while applying the direct-current electric field.

(7) In the above (4), the method of manufacturing the piezoelectric single-crystal device includes a step for cutting the single-crystal ingot into a single-crystal device having a predetermined shape in a predetermined direction and a main polarization step for polarizing the single-crystal device in the [110] direction by applying an electric field under predetermined conditions.

(8) The method of manufacturing the piezoelectric single-crystal device in the above (4) or (7), the main polarization step is conducted by applying a direct-current electric field of 350 to 1500 V/mm to the single-crystal device along the [110] direction in the temperature range of 20 to 200° C., or by applying a direct-current electric field of 250 to 500 V/mm at a temperature higher than the Curie temperature (Tc) of the single-crystal device and then cooling to a room temperature while applying the direct-current electric field.

(9) In the above (4) to (8), the method of manufacturing the piezoelectric single-crystal device further includes a subsidiary polarization step to be conducted before or after the main polarization step by applying an electric field in the direction approximately orthogonal to the polarization direction.

Examples of the electric field to be applied in the direction 1 orthogonal to the polarization direction 3 include a direct-current electric field, a pulse electric field, an alternating-current electric field, steady states thereof, and an attenuation electric field. Optimum conditions of electric field intensity, application time, and temperature may be experimentally determined according to the characteristics of the individual piezoelectric single-crystal devices and the desired value of the electromechanical coupling factor $k_{31}$ in the direction 1 orthogonal to the polarization direction 3. Additionally, as the pulse electric field, a unipolar or bipolar pulse of an alternating triangle wave, in addition to a square wave, may be used.

According to the present invention, piezoelectric single-crystal devices which actively utilize the electromechanical coupling factor $k_{31}$ in the direction 1 orthogonal to the polarization direction 3 (lateral vibration mode) can be manufactured. That is, the piezoelectric single-crystal devices can be used in, for example, accurate positioning actuators for magnetic heads, image stabilizers for digital cameras, and cardiac pacemaker sensors.

Figure 1:
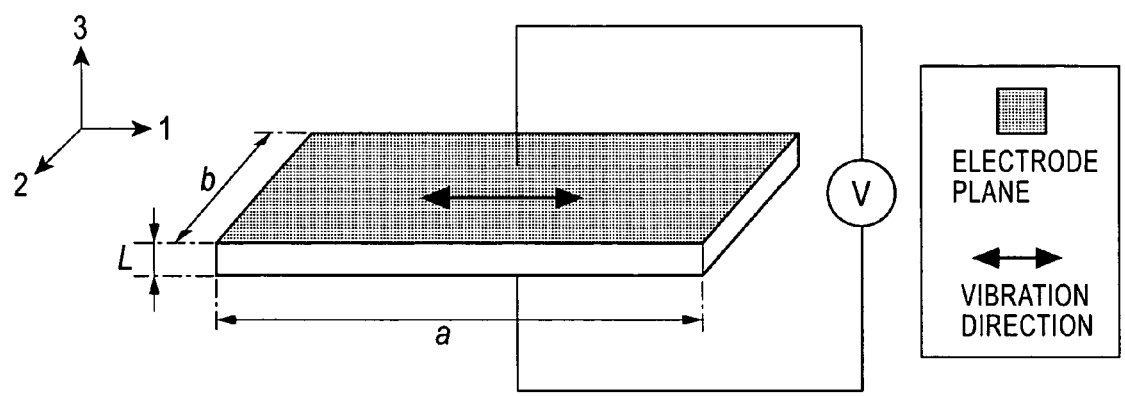
FIG. 1 is a perspective view illustrating an orientation and a shape of a piezoelectric single-crystal device according to the present invention and showing its state to be polarized.

REFERENCE NUMERALS 10 piezoelectric single-crystal device
10a top face of piezoelectric single-crystal device (or electrode plane)
10b bottom face of piezoelectric single-crystal device (or electrode plane)
T or 10c end face utilizing the lateral vibration mode of piezoelectric single-crystal device
11 single-crystal wafer
a size of single-crystal device in the lateral direction (lateral vibration direction 1)
b size of end face of single-crystal device (depth (direction 2))
b' convex end face of single-crystal device
b" concave end face of single-crystal device
L size of single-crystal device in the longitudinal direction (polarization direction 3)
V direct-current voltage
E electric field
1 direction (lateral vibration direction) normal to end face of device
3 polarization direction (longitudinal vibration direction)

BEST MODE FOR CARRYING OUT THE INVENTION

Grounds of the limitation in the piezoelectric single-crystal devices according to the present invention will now be described.

Figure 7A:
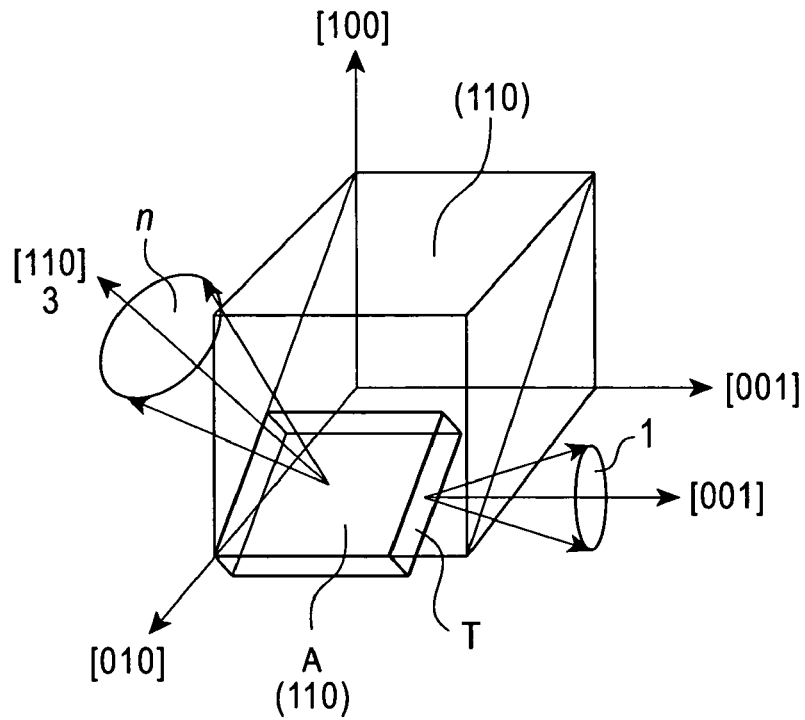
FIG. 7A is a diagram illustrating a direction 1 normal to a suitable end face T of a piezoelectric single-crystal device using the electromechanical coupling factor $k_{31}$ in the [001] direction approximately orthogonal to the [110] direction which is the polarization direction 3 (lateral vibration mode).

(1) Relationship Between Polarization Direction 3 and Direction 1 Normal to End Face T of Piezoelectric Device:

With reference to FIG. 7A, when the polarization direction 3 is the [110] axis of a pseudocubic system, the direction 1 normal to the end face T of the Piezoelectric device resides within a conical solid angle of the [001] axis ±35° including the [001] axis approximately orthogonal to the polarization direction 3. Here, as shown in FIG. 7A, the direction n normal to the broadest face of the piezoelectric single-crystal device resides within a conical solid angle of the [110] axis ±35° including the [110] axis which is the polarization direction.

The grounds for limiting the angle range of the direction 1 normal to the end face T or the piezoelectric device are as follows: When the direction 1 normal to the end face T of the piezoelectric device resides in the angle range of the [001] axis ±35° including the [001] axis approximately orthogonal to the polarization direction 3, the vibration in the direction lateral to the [001] axis direction is not dispersed out of the [001] axis direction. Therefore, the energy in the lateral vibration mode in the [001] direction is not decreased and maintained to attain a high electromechanical coupling factor $k_{31}$ of 60% or more. However, when the direction 1 normal to the end face T of the piezoelectric device resides out of the angle range of the [001] axis ±35°, the [011] axis normal to the (011) plane or the [101] axis normal to the (101) plane forms an angle of 60° with the direction normal to the (110) plane which is the main face (broad face) of the piezoelectric device. Therefore, the vibration in the direction lateral to the [001] axis direction is dispersed to two directions of the [001] axis direction and the [011] axis direction or to two directions of the [001] axis direction and the [101] axis direction. This means that the energy in the lateral vibration mode in the [001] axis direction is decreased. As a result, an electromechanical coupling factor $k_{31}$ of 60% or more cannot be attained.

(2) Composition and Structure of Single-crystal Device:

The piezoelectric single-crystal device of the present invention is formed of a solid solution composed of $Pb[(Mg, Nb)_{1-x}Ti_x]O_3$ (wherein X represents the molar fraction of Ti when the total molar fractions of Mg, Nb, and Ti is 1, and X satisfies the formula, 0.1<X<0.35) and having a complex perovskite structure. More preferably, X is defined as 0.2<X<0.33. When the molar fraction X is 0.1 or less, the composition ratio of lead titanate (PT) which is a constituent of the solid solution is too low. Consequently, the piezoelectric properties of the solid solution are deteriorated. As a result, a high electromechanical coupling factor $k_{31}$ in the lateral vibration mode, such as 60% or more, may not be attained. When the molar fraction X is 0.35 or more, phase transition from a pseudocubic system to a tetragonal system occurs in the crystal structure. As a result, the direction of spontaneous polarization lying in the crystal is changed and thereby the structure of the present invention is not obtained and a high $k_{31}$ is not achieved.

When the molar fraction of Mg to Nb, Mg/Nb, in the lead magnesium niobate $[Pb(Mg, Nb)O_3]$ is in the range of 0.45 to 0.54, the complex perovskite structure is maintained. Therefore, the range is included in the scope of the present invention.

Figure 2:
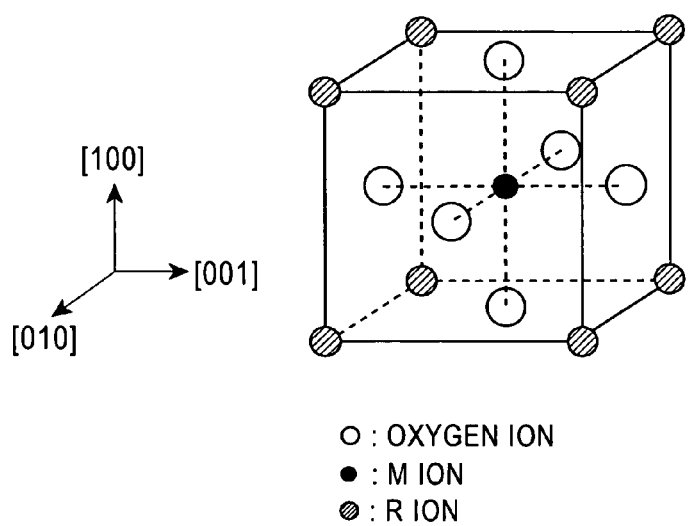
FIG. 2 is a schematic perspective view of a perovskite crystal structure ($RMO_3$).

The crystal structure according to the present invention in a unit lattice shown in FIG. 2 has a complex perovskite structure ($RMO_3$) such that Pb ions are positioned at the vertices of the unit lattice, oxygen ions are positioned at the face centers of the unit lattice, and an M ion, such as Mg, Nb, and Ti, is positioned at the body center of the unit lattice.

The piezoelectric device of the present invention may be composed of lead indium magnesium niobate-lead titanate (PIMN-PT), namely, the piezoelectric device may include indium (In) in addition to lead magnesium niobate-lead titanate (PMN-PT). The content of In is preferably 0.05 to 30 mol %. The ion radius of indium (In) is larger than that of magnesium (Mg) but smaller than that of niobium (Nb). This reduces lattice strain caused by the difference in the ion radius between niobium (Nb) and magnesium (Mg) disposed at the body-centered position of a unit lattice having a perovskite structure and thereby the occurrence of cracking during the single-crystal growth and the occurrence of chipping during the processing of the piezoelectric device are decreased. Therefore, in the present invention, it is necessary that the amount of indium to be added is 0.05 mol % or more in order to achieve the above-mentioned functions. However, the addition of indium more than 30 mol % causes an increase in the melting point of the raw material during the growth of the single crystal. This is not preferable because the process control for manufacturing becomes difficult.

In addition, when it is necessary to increase the relative dielectric constant $\in_r$, 0.5 mol ppm to 5 mol % of each at least one of elements selected from the group consisting of Sb, La, W, and Ta may be further added to the composition of the piezoelectric single-crystal device. When it is necessary to increase the mechanical quality factor Qm, 0.5 mol ppm to 5 mol % of one or more elements selected from Mn and Cr may be added to the composition of the piezoelectric single-crystal device.

Furthermore, Al and Li contribute to the stable growth of a single crystal. In order to achieve this advantageous effect, the content of at least one of Al and Li to be added is preferably 0.05 mol % or more in total.

These atomic elements (Sb, La, W, Ta, Mn, Cr, Al, and Li) are disposed at the body-centered position of a unit lattice or between lattices. When the content of these elements is more than 5 mol % in total, it is difficult to obtain a single crystal, and a polycrystal may be generated.

(2) Substitution of Calcium for 0.05 to 10 mol % of Lead in Crystal Lattice:

When calcium oxide is added to the raw material, the calcium (Ca) of calcium oxide is disposed as substituted atoms at some lead (Pb) positions (R ions in FIG. 2) of a crystal lattice formed of a solid solution of lead-based perovskite structure compounds (lead magnesium niobate, lead titanate, and lead indium niobate) during the single-crystal growth. The calcium inhibits the evaporation of lead oxide at a high temperature. This function of Ca can suppress the generation of a pyrochlore phase. Consequently, a single crystal with a desired complex perovskite phase can be readily generated. In the present invention, in order to achieve the above-mentioned function of Ca, it is necessary to substitute Ca for 0.05 mol % or more of lead. However, the substitution exceeding 10 mol % causes a difficulty in the single-crystal growth. Therefore, preferably, calcium is substituted for 0.05 to 10 mol % of lead in a crystal lattice. More preferably, calcium is substituted for 0.05 to 5 mol % of lead in a crystal lattice.

In order to substitute calcium for 0.05 to 10 mol % of lead in the composition (in a crystal lattice) of a single-crystal ingot, the amount of calcium to be added must be determined with consideration of the amount of calcium that evaporates during the single-crystal growth. The addition of calcium may be conducted by any method without specific limitation. For example, calcium-substituted lead magnesium niobate, calcium-substituted lead zinc niobate, or calcium-substituted lead titanate may be used. Calcium oxide or calcium carbonate may be added to a raw material.

(3) Other Impurities

The piezoelectric single-crystal may be contaminated with impurities such as Fe, Pt, Au, Pd, and Rh from the raw material or a crucible during the manufacturing process. Since these impurities inhibit the generation of the single crystal, the impurities content should be controlled to 0.5 mol % or less in total.

(4) Shape of Piezoelectric Single-crystal Device

Figure 3:
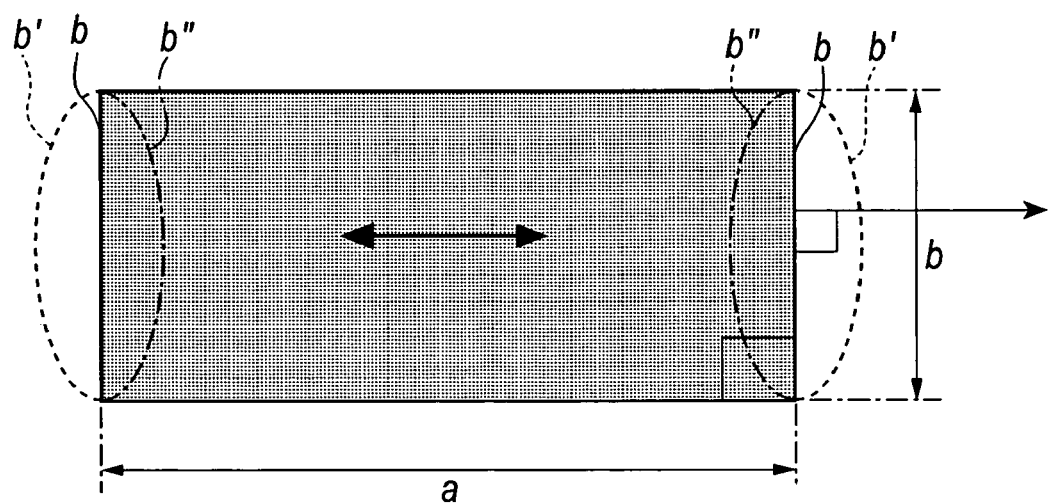
FIG. 3 is a diagram illustrating various end-face shapes of the piezoelectric single-crystal device utilizing the lateral vibration mode according to the present invention.
Figure 3:
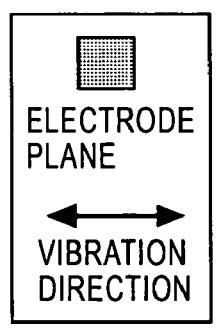

The shape of the "piezoelectric single-crystal device" according to the present invention is preferably a rectangular plate as shown in FIG. 1 to efficiently increase the electromechanical coupling factor $k_{31}$ in the direction 1 orthogonal to the polarization direction 3 (lateral vibration mode). In particular, the shape of the device is preferably a rectangular plate having an aspect ratio (a/b) of 2.5 or more (a/b≧2.5, a>>L, b>>L), more preferably a rectangular plate having an aspect ratio (a/b) of 3 or more. Furthermore, the both ends (short side b) of the rectangular plate of the present invention may be curved in a convex manner b' (dotted line) or in a concave manner b" (alternate long and short dashed line) as shown in FIG. 3 depending on its use. In addition, the device may be a square plate (a=b). The end face T of the piezoelectric device in the present invention is represented by the short side b, which is perpendicular to the long side a, in a planar view as in FIG. 3. Therefore, the direction 1 normal to the end face of the piezoelectric device is parallel to the long side a of the piezoelectric device.

An appropriate method of manufacturing a piezoelectric single-crystal device of the present invention will now be described.

A method of manufacturing the piezoelectric single-crystal device of the present invention includes a main polarization step for polarizing a single-crystal ingot or a single-crystal block by applying an electric field to the single-crystal ingot or the single-crystal block along the [110] direction under predetermined conditions and a step for cutting the single-crystal ingot or the single-crystal block into a single-crystal device having a predetermined shape in a predetermined direction.

Another method of manufacturing the piezoelectric single-crystal device of the present invention includes a step for cutting a single-crystal ingot into a single-crystal device having a predetermined shape in a predetermined direction and a main polarization step for polarizing the single-crystal device by applying an electric field to the single-crystal device along the [110] direction under predetermined conditions.

Here, the single-crystal block is the material cut out from a single-crystal ingot by a wire saw or the like. When the polarization of a single-crystal ingot is difficult because of its shape, the ingot is cut into a single-crystal block so as to be readily polarized, and then the block is polarized.

Grounds of the limitation in each step of the manufacturing method according to the present invention will now be described.

(1) Manufacturing Single-crystal Ingot:

A raw material for a solid-solution single-crystal ingot is prepared so as to have a composition (I) of $Pb[(Mg, Nb)_{1-x} Ti_x]O_3$ (wherein X satisfies the formula, $0.1<X<0.35$); a composition (II) further containing 0.05 to 30 mol % of In and 0.5 mol ppm to 5 mol % of at least one of elements selected from the group consisting of Mn, Cr, Sb, W, Al, La, Li, and Ta, in addition to the above-mentioned composition (I); or a composition further containing calcium substituted for 0.05 to 10 mol % of lead in the above-mentioned composition (I) or (II). A single-crystal ingot may be obtained by dissolving the raw material in a flux and then solidifying it by cooling, or by melting the raw material by heating to a temperature equal to or higher than its melting point and then solidifying it in one direction. As the former method, the Solution Bridgman method and the Top Seeded Solution Growth (TSSG) method are known. As the latter method, the Melt Bridgman method and the Czochralski (CZ) method are known. The present invention is not limited to these methods.

(2) Determination of Crystallographic Orientation of Single-crystal Ingot:

The [110] axis orientation of the single-crystal ingot is roughly determined by the Laue method, and simultaneously, the [001] axis orientation and the [1-10] axis orientation, which are orthogonal to the [110] axis orientation, are roughly determined. The [001] axis in the present invention may reside in the direction of any side of a unit lattice having the perovskite structure.

Then, the crystallographic {110} plane and {100} plane which are orthogonal to any one of crystal axes such as the [110] axis, [1-10] axis, and [001] axis are polished. Furthermore, the orientations of the planes are precisely determined by using an X-ray direction finder, and deviations of the above-mentioned polished faces are corrected.

(3) Rough Cutting (Preparation of Wafer or Block having an Appropriate Thickness):

The single-crystal ingot is cut at a plane being parallel or orthogonal to the polished {110} plane or {100} plane by using a cutting tool such as a wire saw or an inner diamond saw to obtain a plate (wafer) or a block having an appropriate thickness. Additionally, after the cutting, a chemical etching process using an etching solution may be performed, if necessary.

(4) Polishing (Preparation of Wafer having a Predetermined Thickness):

The wafer is ground or polished by using an abrading machine or a grinding machine such as a lapping machine and a polishing machine so that the wafer has a predetermined thickness. Additionally, after the grinding or the polishing, a chemical etching process using an etching solution may be performed, if necessary.

(5) Preparation of Single-crystal Device:

The wafer has the wafer face (the broadest face) in the (110) plane. A single-crystal device having a predetermined shape is cut from the wafer by using a precise cutter such as a dicing saw or a cutting saw so that the direction 1 normal to the end face T resides in the solid angle range of the [001] axis ±35° including the [001] axis. In addition, the block may be directly cut into a device having a predetermined size by using a precise cutter such as a dicing saw or a cutting saw.

(6) Forming of Electrode:

It is necessary to previously form an electrode for applying an electric field in the main polarization step, or further in the subsidiary polarization step.

Before the main polarization step, electrodes are formed on the top and bottom faces, i.e., opposing (110) plane and (-1-10) plane, of the prepared single-crystal device by forming a Cr—Au film (a first layer: Cr layer having a thickness of about 50 nm, a second layer: Au layer having a thickness of about 100 to 200 nm) by sputtering, forming a gold film by plasma deposition, or forming a silver film by screen printing and then firing the film.

In addition, before the subsidiary polarization step, electrodes are formed on opposing faces orthogonal to the subsidiary polarization direction by the same method as above.

When the main polarization step is performed after the subsidiary polarization step or the subsidiary polarization step is performed after the main polarization step, the remaining electrodes used for the first polarization step make the subsequent polarization step unstable. Therefore, it is necessary to completely remove the electrode used for the first polarization step by using an appropriate chemical etching solution or acid.

(7) Main Polarization Step:

When a single crystal cut out from a grown single-crystal ingot is in an unmodified state, the directions of electric dipoles in one domain are the same as that of each other but those of individual domains are in various different directions in the polarization direction 3 and in the directions orthogonal to the direction 3. Therefore, the single crystal does not have the piezoelectricity and is in an unpolarized state.

Consequently, it is necessary to polarize the single crystal. In the piezoelectric device having the composition according to the present invention, it is preferable to apply a direct-current electric field of 350 to 1500 V/mm along a polarization direction 3 of the single-crystal ingot, the cut-out single-crystal block, or the cut-out single-crystal device at the temperature range of 20 to 200° C. When the temperature is lower than 20° C. or when the applied electric field is less than 350 V/mm, the polarization may be insufficient. When the temperature is higher than 200° C. or when the applied electric field is higher than 1500 V/mm, over-poles may occur and thereby the piezoelectric characteristics of the piezoelectric single-crystal device may be deteriorated. In addition, the strain in the crystal is increased due to the excessive electric field and thereby cracking may occur in the piezoelectric single-crystal device.

The polarization time is preferably controlled according to the polarization temperature and the applied electric field which are determined within the above-mentioned appropriate ranges. The upper limit of the polarization time is preferably 180 minutes.

Furthermore, the polarization may be conducted by applying a direct-current electric field of 250 to 500 V/mm along the polarization direction 3 at a temperature higher than Curie temperature Tc (for example, the Tc line in FIG. 4) of the single-crystal device, preferably at the temperature range of 170 to 200° C., and then the temperature is decreased (electric field cooling) to a room temperature while applying the direct-current electric field. The electric dipoles are removed once by increasing the temperature to a level higher than the Curie temperature (Tc), and the direction of the electric dipoles are more regularly aligned by cooling the temperature to a level lower than the Curie temperature while applying the electric field. When the temperature is lower than the Curie temperature, a part of the electric dipoles remains. This causes insufficient polarization. When the applied electric field is less than 250 V/mm, the polarization is insufficient. When the applied electric field is higher than 500 V/mm, over-poles tend to occur. Furthermore, the cooling rate is preferably controlled not to generate cracking in the device during the cooling.

The Curie temperature Tc is a transition temperature that the alignment of electric dipoles is destroyed and the electric dipoles are disorderedly in various different directions at a temperature higher than the Curie temperature, namely, the piezoelectricity or ferroelectricity disappears. The Curie temperature depends on the composition and the material structure (see the Tc line in FIG. 4).

(8) Subsidiary Polarization Step:

The piezoelectric single-crystal device is mainly polarized by the above-mentioned main polarization step. In addition, a subsidiary polarization step is effective to control the alignment of ferroelectric domains in the direction orthogonal to the polarization direction 3 by applying an electric field along a direction orthogonal to the polarization direction 3, desirably, along the lateral vibration direction 1 before or after the main polarization step.

Examples of the electric field applied along the direction orthogonal to the polarization direction 3 include a direct-current electric field, a pulse electric field, an alternating-current electric field, steady states thereof, and an attenuation electric field. The conditions such as electric field intensity, electric-field application time, and temperature are properly determined based on the characteristics of the individual piezoelectric single-crystal devices and the desired value of the electromechanical coupling factor $k_{31}$ in the direction orthogonal to the polarization direction 3. These conditions can be experimentally determined. In order to obtain the advantageous effect of the subsidiary polarization, it is preferable that the subsidiary polarization temperature be in the range from 25° C. to the phase transition temperature (for example, the Trt line shown in FIG. 4) and the electric field to be applied is in the range from 350 to 1500 V/mm. Furthermore, it is preferable that the polarization time be suitably controlled according to the above-mentioned preferable ranges of the polarization temperature and the electric field to be applied. In particular, the preferable polarization time is in the range from 10 minutes to 2 hours.

Figure 5:
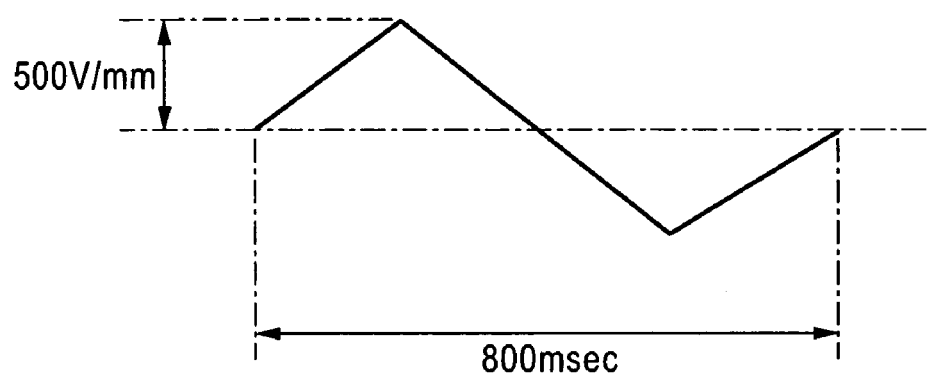
FIG. 5 is a waveform diagram of a bipolar triangle pulse.

Additionally, as the above-mentioned pulse electric field, a unipolar or bipolar pulse of an alternating triangle wave as shown in FIG. 5, in addition to a square wave, may be used.

EXAMPLE 1

Figure 6:
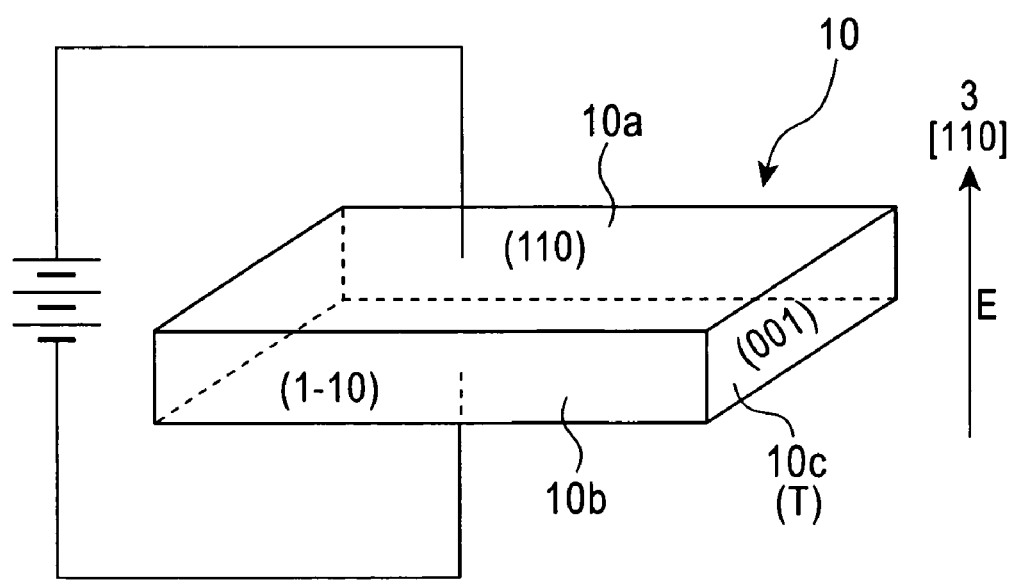
FIG. 6 is an explanatory diagram when a direct-current electric field is applied to a single crystal.

FIG. 6 shows a shape of a piezoelectric single-crystal device 10 (Curie temperature Tc=138° C., device shape: 13 mm in length×4 mm in width×0.36 mm in thickness). The device is formed of a piezoelectric single-crystal material 10 composed of lead magnesium niobate (PMN) and lead titanate (PT), PMN-PT, (composition formula: $Pb[(Mg, Nb)_{1-x}Ti_x]O_3$, wherein X=0.26).

The piezoelectric single-crystal device 10 was manufactured as follows: A composition of $Pb[(Mg, Nb)_{1-x}Ti_x]O_3$ (wherein X=0.26) was prepared and a single-crystal ingot was prepared from the composition by the Melt Bridgman method. Then, the crystallographic orientation of the single-crystal ingot was precisely determined. The single-crystal ingot was polished and cut along a plane parallel to the (110) plane, which is the polished face, by using a wire saw to obtain a plate having a thickness of 0.5 mm. The plate was polished by using a polishing machine to obtain a wafer having a thickness of 0.36 mm. Then, a device was cut out from this wafer by using a dicing saw so as to have a shape of 13 mm in length×4 mm in width×0.36 mm in thickness.

Figure 7B:
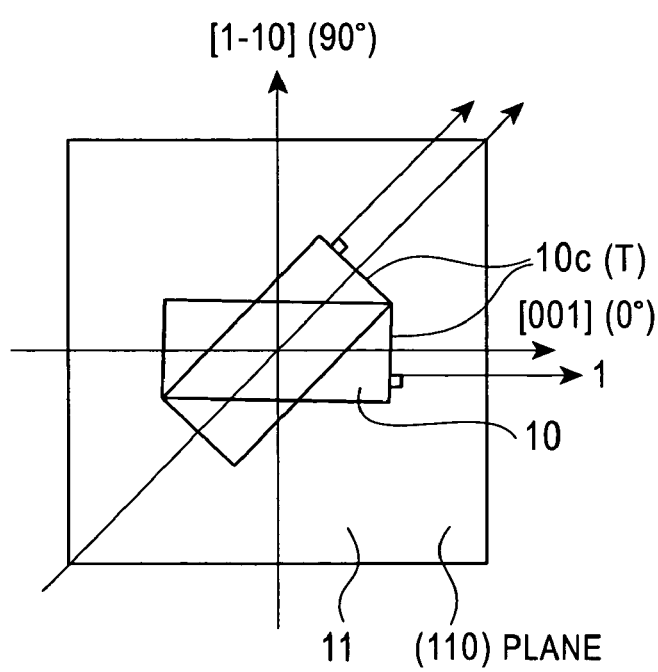
FIG. 7B is a diagram illustrating directions for cutting a single-crystal wafer 11 into various single-crystal devices having the direction 1 normal to the end face 10c (or T) of the piezoelectric device within the range of 0 to 90°.

Here, in order to investigate for the value of electromechanical coupling factor k31 of the lateral vibration mode when the polarization direction 3 was in the [110] axis of a pseudocubic system and the orientation (more precisely, the direction 1 normal to the end face) of the end face 10c (or T) of the piezoelectric device was changed, as shown in FIG. 7B, the piezoelectric single-crystal devices were cut out by using a dicing saw while changing the direction 1 normal to the end face of the piezoelectric device utilizing the lateral vibration mode from 0° ([001] direction) to 90° ([1-10] direction) by 5°. Gold electrodes were produced on the opposing top and bottom faces 10a and 10b of each produced single-crystal device by forming Cr—Au films (a first layer: Cr layer having a thickness of about 50 nm, a second layer: Au layer having a thickness of about 100 to 200 nm) by sputtering. Then, the single-crystal device was polarized in the direction ([110] direction) vertical to the surface of the paper on which FIG. 7B was drawn by a polarization method, which was conducted by applying a direct-current electric field of 700 V/mm for 60 minutes in an air atmosphere at 25° C., to obtain a piezoelectric single-crystal device. The electromechanical coupling factors K31 in the lateral vibration mode was calculated using a known equation (see Electronic Materials Manufacturers Association of Japan Standard: EMAS-6008, 6100). Table 1 shows the results.

Here, the angle range of the direction 1 from 0° to 90° with respect to the [001] axis direction of the plane (in FIG. 7B, the surface of the paper, precisely, the crystal plane including the [001] axis and the [1-10] axis orthogonal to the polarization direction 3) orthogonal to the polarization direction is necessary and sufficient for obtaining information relating to all directions in this crystal plane orthogonal to the polarization direction 3 because of the symmetry property of the cubic system. For reference, the electromechanical coupling factor $k_{31}$ of the piezoelectric device produced from a sintered body of lead zirconate titanate ($Pb(Zr, Ti)O_3$: PZT) is also shown in Table 1 as a conventional example. The PZT is a sintered body and does not have anisotropy arising from a crystal orientation, unlike the above-mentioned piezoelectric single-crystal. Consequently, the electromechanical coupling factor $k_{31}$ value in the lateral vibration mode of the PZT is constant in all crystal orientations independent of the direction 1 normal to the end face 10c (or T).

With the results shown in Table 1, it is confirmed that when the direction 1 resides within the angle range of 0° to 35° (equivalent to the angle range of from −35° to +35° because of the symmetry property of the crystal (pseudocubic system)) including the [001] axis (0°) in the plane orthogonal to the polarization direction 3, the device has an electromechanical coupling factor $k_{31}$ of 60% or more and is suitable for utilizing the lateral direction.

In addition, the values of $k_{31}$ were measured in more detail by an angle smaller than 5° within the angle range of the [001] axis (0°)±35°. The results show that the electromechanical coupling factor $k_{31}$ value was always 60% or more in this angle range. Furthermore, in this EXAMPLE, the [110] direction of the single-crystal plate was the polarization direction 3 and a suitable orientation was confirmed in the (110) plane orthogonal to the [110] direction of the face of the largest area of the piezoelectric single-crystal device of 13 mm×4 mm×0.36 mm. In some piezoelectric single-crystal devices having the direction 1 normal to the end face T within the solid angle range of the [001] axis ±35° shown in FIG. 7A, when the direction 1 resides in the [001] axis ±15° in the (1–10) plane orthogonal to the (110) plane, the value of $k_{31}$ was 65%.

In addition, a piezoelectric single-crystal device composed of lead indium magnesium niobate (PIMN) and lead titanate (PT), PIMN-PT, was manufactured by the same method as above and the electromechanical coupling factor $k_{31}$ was investigated under the same test conditions as above. As shown in Table 1, it was confirmed that the device had a high electromechanical coupling factor $k_{31}$ which was approximately the same as that of the 74PMN-26PT. The content of indium was 20 mol %.

EXAMPLE 2

Piezoelectric single-crystal materials Nos. 1 to 9 composed of $Pb[(Mg, Nb)_{1-x}Ti_x]O_3$ containing different molar fractions of Ti as shown in Table 2 were prepared by the same method as in EXAMPLE 1. The electromechanical coupling factor $k_{31}$ of each material was calculated by the same method as in EXAMPLE 1. Table 2 shows the results. The values of the electromechanical coupling factor $k_{31}$ shown in Table 2 are averages of 5 samples of each piezoelectric single-crystal material. The piezoelectric single-crystal materials were cut into piezoelectric single-crystal devices each having a shape of 13 mm in length×4 mm in width×0.36 mm in thickness by using a dicing saw so that the orientation of each piezoelectric single-crystal device had the direction 1 normal to the end face T of the piezoelectric device at 0° with respect to the [001] axis, as in the EXAMPLE 1.

With respect to the results shown in Table 2, when the molar fraction X of Ti satisfied the formula, 0.1<X<0.35, the values of electromechanical coupling factor $k_{31}$ were in the range of 63.0 to 87.7%. Thus, every device material according to the present invention can stably achieve a high electromechanical coupling factor $k_{31}$ of 60% or more.

On the other hand, in the material No. 1 which was a COMPARATIVE EXAMPLE containing Ti in a molar fraction X of 0.1 or less, the value of the electromechanical coupling factor k31 was 54.8%. In the material No. 9 which was a COMPARATIVE EXAMPLE containing Ti in a molar fraction X of 0.35 or more, the crystal structure was not a pseudocubic system but a tetragonal system and the value of the $k_{31}$ was low, i.e., less than 20%.

EXAMPLE 3

Then, a polarization method suitable for manufacturing a piezoelectric single-crystal device suitable for utilizing the lateral vibration mode will now be described. Table 3 shows electromechanical coupling factor $k_{31}$ values in the lateral vibration mode when the piezoelectric single-crystal devices 10 were manufactured under various polarization conditions. The method for manufacturing the piezoelectric single-crystal devices, the device size, and the test conditions were the same as those in EXAMPLE 1. The compositions of the piezoelectric single-crystal devices were the same as those in EXAMPLE 1. Table 3 shows the results. The piezoelectric single-crystal materials were cut into piezoelectric single-crystal devices each having a shape of 13 mm in length×4 mm in width×0.36 mm in thickness by using a dicing saw so that the orientation of each piezoelectric single-crystal device had the direction 1 normal to the end face T of the piezoelectric device at 0° with respect to the [001] axis, as in the EXAMPLE 1.

In the piezoelectric single-crystal device of the cases (1) to (7) in Table 3, the polarization step was conducted by applying a direct-current electric field of 350 to 1500 V/mm in the temperature range of 25 to 60° C. for 30 to 180 minutes. In these cases, the values of the electromechanical coupling factor $k_{31}$ of crystals suitable for utilizing the lateral vibration mode were in the range of 68.2 to 87.7% in lead magnesium niobate (PMN)-lead titanate (PT) (Ti molar fraction X: 26 mol %). Thus, the values were 60% or more in every crystal.

Piezoelectric single-crystal devices composed of lead indium magnesium niobate (PIMN) and lead titanate (PT), PIMN-PT, were manufactured by the same method as in the devices composed of lead magnesium niobate (PMN)-lead titanate (PT). The electromechanical coupling factor $k_{31}$ were investigated under the same test conditions as in the devices composed of lead magnesium niobate (PMN)-lead titanate (PT). As shown in (1) to (7) of Table 3, piezoelectric single-crystal. devices having a high electromechanical coupling factor $k_{31}$ were obtained by applying a direct-current electric field of 350 to 1500 V/mm at the temperature range of 25 to 60° C. Thus, the piezoelectric single-crystal devices having a composition containing In in a proper range (20 mol %) in addition to lead magnesium niobate (PMN)-lead titanate (PT) (Ti molar fraction X: 28 mol %) showed the similar results to those in the devices composed of lead magnesium niobate (PMN)-lead titanate (PT) (Ti molar fraction X: 26 mol %).

Even if the temperature range and the electric field range for polarization are out of the above-mentioned suitable ranges, the piezoelectric single-crystal devices are within the scope of the present invention. However, when the temperature for polarizing piezoelectric single crystals was 25° C. and the applied electric field was 320 V/mm which was lower than the lower limit of the suitable range of the present invention, the $k_{31}$ values were less than 60% in some of 74PMN-26PT devices and 72PIMN-28PT devices.

When the temperature of piezoelectric single-crystal materials was 40° C. and the applied electric field was 1700 V/mm which was higher than the upper limit of the suitable range of the present invention, the $k_{31}$ values were less than 60% in some of 74PMN-26PT devices and 72PIMN-28PT devices of EXAMPLES of the present invention. In addition, the cracking occurred in some piezoelectric single-crystal devices during the application of the electric field or immediately after the application of the electric field.

Figure 4:
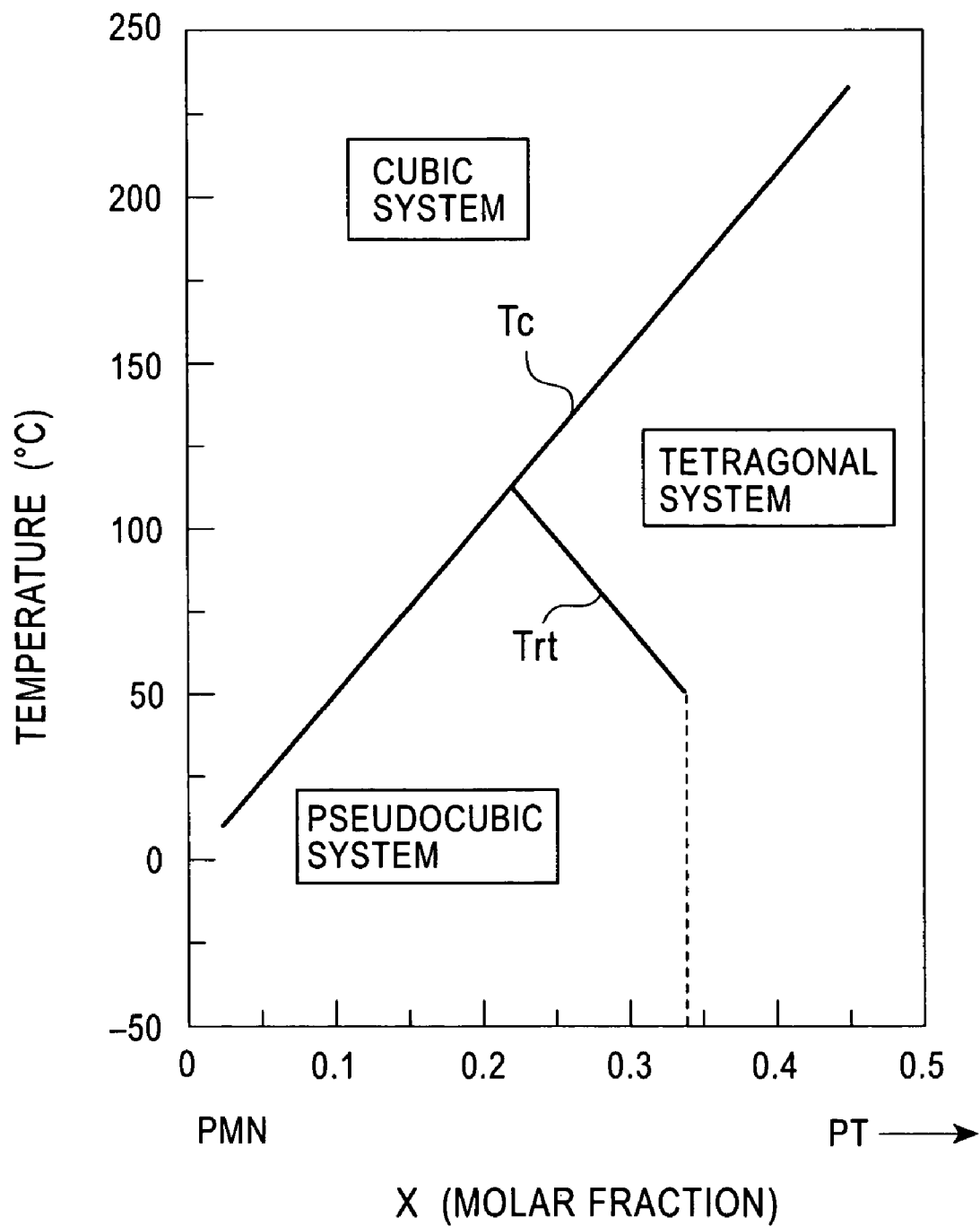
FIG. 4 is a phase diagram of PMN-PT (PMNT).

Furthermore, crystals suitable for 74PMN-26PT devices or 72PIMN-28PT devices of EXAMPLES of the present invention utilizing the lateral vibration mode were applied with a direct-current electric field of 400 V/mm in silicon oil at a temperature of 200° (within the scope of the present invention) which was above the Curie temperature Tc shown in FIG. 4. The polarization time was adjusted according to the applied electric field. The results are shown in No. 8 in Table 3. In the 74PMN-26PT devices and the 72PIMN-28PT devices of EXAMPLES of the present invention, high electromechanical coupling factor $k_{31}$ values were achieved in the suitable polarization conditions of the present invention. This shows the fact that the method for cooling while applying an electric field (electric field cooling) is effective.

When the applied electric field was less than 250 V/mm, the electromechanical coupling factor $k_{31}$ values of some 74PMN-26PT devices and 72PIMN-28PT devices of EXAMPLES of the present invention were less than 60%. On the other hand, when the applied electric field was higher than 500 V/mm, the values of the electromechanical coupling factor $k_{31}$ of some devices were less than 60%. In addition, the cracking occurred in some piezoelectric single-crystal devices during or immediately after the application of an electric field of 600 V/mm.

As described above, both 74PMN-26PT devices and 72PIMN-28PT devices of EXAMPLES of the present invention can stably achieve favorable electromechanical coupling factor $k_{31}$ values in the suitable polarization conditions of the present invention.

EXAMPLE 4

Then, a subsidiary polarization method suitable for manufacturing a piezoelectric single-crystal device which is suitable for utilizing the lateral vibration mode will now be described. Table 4 shows electromechanical coupling factor $k_{31}$ values in the lateral vibration mode of the piezoelectric single-crystal devices manufactured under various subsidiary polarization conditions. The method for manufacturing the piezoelectric single-crystal devices, the device size, and the test conditions were the same as those in EXAMPLE 1. The compositions of the piezoelectric single-crystal devices were the same as those in EXAMPLE 1. The piezoelectric single-crystal materials were cut into piezoelectric single-crystal devices each having a shape of 13 mm in length×4 mm in width×0.36 mm in thickness by using a dicing saw so that the direction 1 normal to the end face 10c of each piezoelectric device was at 15° with respect to the [001] axis.

Electrodes were produced by forming Cr—Au films (a first layer: Cr layer having a thickness of about 50 nm, a second layer: Au layer having a thickness of about 100 to 200 nm) by sputtering on both end faces 10c of suitable crystals for utilizing lateral mode manufactured by the same method as in EXAMPLE 1. The subsidiary polarization was conducted by applying a direct-current electric field of 320 to 1700 V/mm in the subsidiary polarization temperature range of 25 to 40° for a polarization time of 10 to 150 minutes. Then, the electrodes were completely removed by dissolving the electrodes with a chemical etching solution or acid. Then, electrodes were formed on the opposing top and bottom faces 10a and 10b of the single-crystal device material 10 by forming Cr—Au films (a first layer: Cr layer having a thickness of about 50 nm, a second layer: Au layer having a thickness of about 100 to 200 nm) by sputtering. Then, as the main polarization step, a direct-current electric field of 700 V/mm was applied in an air atmosphere at 25° for 60 minutes. Table 4 shows the results of electromechanical coupling factor k31 values. The values shown in (1) to (5) of Table 4 are results of piezoelectric single-crystal devices produced-under the subsidiary polarization conditions by applying a direct-current electric field of 350 to 1500 V/mm at the temperature range of 25 to 40° for 10 to 120 minutes.

In these case, the values of the electromechanical coupling factor $k_{31}$ of the lead magnesium niobate (PMN)-lead titanate (PT) (Ti molar fraction X: 26 mol %) were further higher than that of the device, which did not receive the subsidiary polarization treatment, shown in (9) of Table 4. The device shown in (6), which received the subsidiary polarization after the main polarization step under the same conditions as those in the device shown in (2), achieved a high electromechanical coupling factor $k_{31}$ value of 87.3%.

In addition, when the devices applied with a bipolar triangle-wave pulse electric field as shown in FIG. 5 was applied before the main polarization step for 10 minutes, high electromechanical coupling factor $k_{31}$ values were achieved as shown in (7) and (8) of Table 4.

Piezoelectric single-crystal devices having a composition containing In in a proper range (20 mol %) in addition to the lead magnesium niobate (PMN)-lead titanate (PT) (Ti molar fraction X: 28 mol %) were produced by the same method as that of the piezoelectric single-crystal device composed of lead magnesium niobate (PMN)-lead titanate (PT), and the electromechanical coupling factor $k_{31}$ was measured by the same test conditions as those in lead magnesium niobate (PMN)-lead titanate (PT). The results are shown in (1) to (8) of Table 4. The electromechanical coupling factor $k_{31}$ values of crystals suitable for utilizing the lateral vibration mode were improved by the subsidiary polarization, which was conducted before or after the main polarization step under the conditions such as the temperature range of 25 to 40°, the direct-current electric field range of 350 to 1500 V/mm, and a bipolar triangle-wave pulse electric field, as in the lead magnesium niobate (PMN)-lead titanate (PT).

When the temperature for the subsidiary polarization of the piezoelectric single crystal materials was 25° C. and the applied electric field was 320 V/mm which was lower than the lower limit of the suitable range of the present invention, the electromechanical coupling factor $k_{31}$ values were less than 60% in some of the 74PMN-26PT devices and the 72PIMN-28PT devices of EXAMPLES of the present invention. When the temperature of piezoelectric single-crystal materials produced by the same method as in EXAMPLE 1 was 40° C. and the applied electric field was 1700 V/mm which was higher than the upper limit of the suitable range of the present invention, the electromechanical coupling factor $k_{31}$ values were less than 60% in some of the 74PMN-26PT devices and the 72PIMN-28PT devices of EXAMPLES of the present invention. In addition, the cracking occurred in some piezoelectric single-crystal devices.

INDUSTRIAL APPLICABILITY

According to the present invention, it is possible to manufacture a piezoelectric single-crystal device actively utilizing the electromechanical coupling factor $k_{31}$ in a direction orthogonal to the polarization direction (lateral vibration mode). That is, the piezoelectric single-crystal devices can be used in, for example, accurate positioning actuators for magnetic heads, piezoelectric gyro devices, image stabilizers for digital cameras, and cardiac pacemaker sensors.

TABLE 1

| Crystal orientation | Angle (°) | Electromechanical coupling factor $k_{31}$ (%) | | |
|---|---|---|---|---|
| | | 74PMN-26PT (Ti: 26 mol %) | 72PIMN-28PT (Ti: 28 mol %) (In: 20 mol %) | Pb(Zr, Ti)O$_3$ |
| [001] | 0 | 87.7 | 85.3 | 30 |
| | 5 | 85.8 | 83.7 | |
| | 10 | 81.2 | 79.8 | |
| | 15 | 79.4 | 77.4 | |
| | 20 | 73.6 | 70.2 | |
| | 25 | 70.4 | 68.9 | |
| | 30 | 67.3 | 66.0 | |
| | 35 | 61.0 | 61.0 | |
| | 40 | 53.7 | 52.8 | |
| | 45 | 51.4 | 50.3 | |
| | 50 | 45.3 | 44.9 | |
| | 55 | 46.1 | 45.3 | |
| | 60 | 40.2 | 41.2 | |
| | 65 | 35.4 | 35.1 | |
| | 70 | 31.2 | 32.0 | |
| | 75 | 28.6 | 29.0 | |
| | 80 | 25.5 | 24.8 | |
| | 85 | 24.3 | 23.7 | |
| [1-10] | 90 | 24.0 | 22.0 | |

TABLE 2

| Material No. | PMN-PT | | Evaluation result Electromechanical coupling factor $k_{31}$ (%) | Note |
|---|---|---|---|---|
| | PMN mol % | PT mol % | | |
| 1 | 92.0 | 8.0 | 54.8 | COMPARATIVE EXAMPLE |
| 2 | 90.0 | 10.0 | 63.0 | EXAMPLE of the present invention |
| 3 | 86.4 | 13.6 | 67.3 | EXAMPLE of the present invention |
| 4 | 81.3 | 18.7 | 69.5 | EXAMPLE of the present invention |
| 5 | 75.4 | 24.6 | 78.0 | EXAMPLE of the present invention |
| 6 | 70.7 | 29.3 | 87.7 | EXAMPLE of the present invention |
| 7 | 67.3 | 32.7 | 82.1 | EXAMPLE of the present invention |
| 8 | 65.1 | 34.9 | 63.0 | EXAMPLE of the present invention |
| 9 | 63.0 | 37.0 | <20.0 | COMPARATIVE EXAMPLE |

TABLE 3

| | Polarization condition | | | Piezoectric single-crystal device 10 Electromechanical coupling factor $k_{31}$ (%) | | Note |
|---|---|---|---|---|---|---|
| | Temperature °C. | Electric field V/mm | Time min | 74PMN-26PT (Ti: 26 mol %) | 72PIMN-28PT (Ti: 28 mol %) (In: 20 mol %) | |
| (1) | 25 | 350 | 180 | 68.2 | 67.2 | EXAMPLE of the present invention |
| (2) | 60 | 400 | 180 | 74.3 | 72.4 | EXAMPLE of the present invention |
| (3) | 25 | 700 | 100 | 87.7 | 83.6 | EXAMPLE of the present invention |
| (4) | 25 | 700 | 60 | 86.8 | 83.1 | EXAMPLE of the present invention |
| (5) | 40 | 900 | 70 | 86.7 | 83.1 | EXAMPLE of the present invention |
| (6) | 30 | 1200 | 60 | 86.4 | 82.8 | EXAMPLE of the present invention |
| (7) | 40 | 1500 | 30 | 85.7 | 82.4 | EXAMPLE of the present invention |

TABLE 3-continued

| | Polarization condition | | | Piezoelectric single-crystal device 10 Electromechanical coupling factor $k_{31}$ (%) | | |
|---|---|---|---|---|---|---|
| | Temperature °C. | Electric field V/mm | Time min | 74PMN-26PT (Ti: 26 mol %) | 72PIMN-28PT (Ti: 28 mol %) (In: 20 mol %) | Note |
| (8) | 200→25 (electric field cooling) | 400 | 120 | 87.3 | 83.2 | EXAMPLE of the present invention |

TABLE 4

| | Subsidiary polarization condition | | | | Piezoelectric single-crystal device 10 Electromechanical coupling factor $k_{31}$ (%) | | |
|---|---|---|---|---|---|---|---|
| | Temperature °C. | Type of electric field | Electric field V/mm | Time min | Performance of subsidiary polarization | 74PMN-26PT (Ti: 26 mol %) | 72PIMN-28PT (Ti: 28 mol %) (In: 20 mol %) | Note |
| (1) | 40 | Direct current | 350 | 120 | Before main polarization | 79.8 | 76.3 | EXAMPLE of the present invention |
| (2) | 25 | Direct current | 700 | 100 | Before main polarization | 88.1 | 84.3 | EXAMPLE of the present invention |
| (3) | 40 | Direct current | 900 | 70 | Before main polarization | 87.5 | 83.9 | EXAMPLE of the present invention |
| (4) | 30 | Direct current | 1200 | 60 | Before main polarization | 87.0 | 83.1 | EXAMPLE of the present invention |
| (5) | 40 | Direct current | 1500 | 10 | Before main polarization | 86.0 | 82.8 | EXAMPLE of the present invention |
| (6) | 25 | Direct current | 700 | 100 | After main polarization | 87.3 | 83.6 | EXAMPLE of the present invention |
| (7) | 25 | Triangle wave pulse | The maximum value: 500 V/mm, at an interval of 800 msec for 10 min | | Before main polarization | 87.7 | 83.4 | EXAMPLE of the present invention |
| (8) | 25 | | | | After main polarization | 87.3 | 83.1 | EXAMPLE of the present invention |
| (9) | No subsidiary polarization | | | | | 79.4*[1] | 75.8 | EXAMPLE of the present invention |

(Remarks) Angle in EXAMPLE 1 (Table 1): 15°, Ti: value of sample containing 26 mol % of Ti

The invention claimed is:

1. A piezoelectric single-crystal device having:
   a polarization direction in the [110] axis of a pseudocubic system; and
   a direction normal to an end face of the piezoelectric single-crystal device that is within a solid angle range of ±35° of the [001] axis, the [001] axis being approximately orthogonal to the polarization direction,
   wherein the electromechanical coupling factor k31 is 60% or more in a direction orthogonal to the polarization direction and in the so-called lateral vibration mode.

2. The piezoelectric single-crystal device according to claim 1, the piezoelectric single-crystal device being formed of a piezoelectric single-crystal material of a solid solution having a complex perovskite structure and composed of $Pb[(Mg, Nb)_{1-x}Ti_x]O_3$ (wherein X represents a molar fraction of Ti when a total molar fractions of Mg, Nb, and Ti is 1, and x satisfies: 0.1<x<0.35.

3. The piezoelectric single-crystal device according to claim 2, wherein the solid solution further contains 0.05 to 30 mol % of In.

4. A method of manufacturing the piezoelectric single-crystal device according to claim 1, the method comprising:
first polarizing a single-crystal ingot, a cut-out single-crystal block, or a cut-out single-crystal device by applying an electric field along the [110] direction to be polarized under predetermined conditions, wherein the first polarizing is conducted before or after cutting the single-crystal ingot into the single-crystal device having a predetermined shape in a predetermined direction.

5. The method of manufacturing the piezoelectric single-crystal device according to claim 4, the method further comprising cutting the single-crystal ingot or the single-crystal block into a single-crystal device having the predetermined shape in the predetermined direction.

6. The method of manufacturing the piezoelectric single-crystal device according to claim 4, the first polarizing comprising:
applying a first direct-current electric field of 350 to 1500 V/mm to the single-crystal ingot or the single-crystal block along the [110] direction at a temperature range of 20 to 200° C.; or
applying a second direct-current electric field of 250 to 500 V/mm at a temperature higher than a Curie temperature (Tc) of the single-crystal ingot, and then cooling to a room temperature while applying the second direct-current electric field.

7. The method of manufacturing the piezoelectric single-crystal device according to claim 4, the method further comprising cutting the single-crystal ingot into a single-crystal device having the predetermined shape in the predetermined direction; and then
first polarizing the single-crystal device by applying an electric field to the single-crystal device along the [110] direction under the predetermined conditions.

8. The method of manufacturing the piezoelectric single-crystal device according to claim 4, the first polarizing comprising:
applying a first direct-current electric field of 350 to 1500 V/mm to the single-crystal device along the [110] direction at a temperature range of 20 to 200° C.; or
applying a second direct-current electric field of 250 to 500 V/mm at a temperature higher than Curie temperature (Tc) of the single-crystal device, and then cooling to a room temperature while applying the second direct-current electric field.

9. The method of manufacturing the piezoelectric single-crystal device according to claim 4, the method further comprising:
second polarizing by applying an electric field in the direction orthogonal to the polarization direction, wherein the second polarizing is conducted before or after the first polarizing.

* * * * *